(12) United States Patent
Chandra et al.

(10) Patent No.: US 10,842,017 B2
(45) Date of Patent: Nov. 17, 2020

(54) PRINTED CIRCUIT BOARDS WITH NON-FUNCTIONAL FEATURES

(71) Applicant: DELL PRODUCTS L.P., Round Rock, TX (US)

(72) Inventors: Umesh Chandra, Santa Cruz, CA (US); Bhyrav M. Mutnury, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 16/260,595

(22) Filed: Jan. 29, 2019

(65) Prior Publication Data
US 2020/0245451 A1 Jul. 30, 2020

(51) Int. Cl.
*H05K 1/02* (2006.01)
*H05K 1/11* (2006.01)

(52) U.S. Cl.
CPC ......... *H05K 1/0245* (2013.01); *H05K 1/0251* (2013.01); *H05K 1/113* (2013.01); *H05K 1/115* (2013.01); *H05K 1/0216* (2013.01)

(58) Field of Classification Search
CPC .... H05K 1/0245; H05K 1/115; H05K 1/0251; H05K 1/0216; H05K 1/025; H05K 1/0253; H05K 1/11; H05K 1/111; H05K 1/112; H05K 1/113; H05K 1/114; H05K 1/116; H05K 2201/09372; H05K 2201/09454; H05K 2201/09463; H05K 2201/095; H05K 2201/09509; H05K 2201/09518; H05K 2201/09536; H05K 2201/09645; H05K 2201/10666

See application file for complete search history.

(56) References Cited

U.S. PATENT DOCUMENTS

| | | | |
|---|---|---|---|
| 7,897,880 B1 * | 3/2011 | Goergen | H05K 1/0237 174/261 |
| 2005/0029013 A1 | 2/2005 | Lee | |
| 2005/0191785 A1 * | 9/2005 | Howard | H01L 23/49827 438/106 |
| 2007/0039171 A1 | 2/2007 | Goergen | |
| 2009/0045889 A1 | 2/2009 | Goergen et al. | |
| 2010/0282503 A1 * | 11/2010 | Kushta | H05K 1/0251 174/266 |
| 2010/0314163 A1 * | 12/2010 | Twardy | H05K 1/0268 174/266 |
| 2011/0240348 A1 * | 10/2011 | Lau | H05K 1/0251 174/257 |
| 2013/0098671 A1 * | 4/2013 | Thurairajaratnam | H05K 1/024 174/266 |
| 2017/0188452 A1 * | 6/2017 | Chen | H05K 1/0215 |
| 2018/0228019 A1 | 8/2018 | Becker et al. | |

* cited by examiner

*Primary Examiner* — Ishwarbhai B Patel
(74) *Attorney, Agent, or Firm* — Haynes and Boone, LLP

(57) ABSTRACT

A multi-layer PCB has conductive vias (134) passing through multiple layers. A layer may have a conductive non-functional feature (710) physically contacting a via but not surrounding the via, to make the PCB more resistant to thermal stresses while, at the same time, reducing the parasitic capacitance compared to a prior art non-functional pad (310*n*).

20 Claims, 6 Drawing Sheets

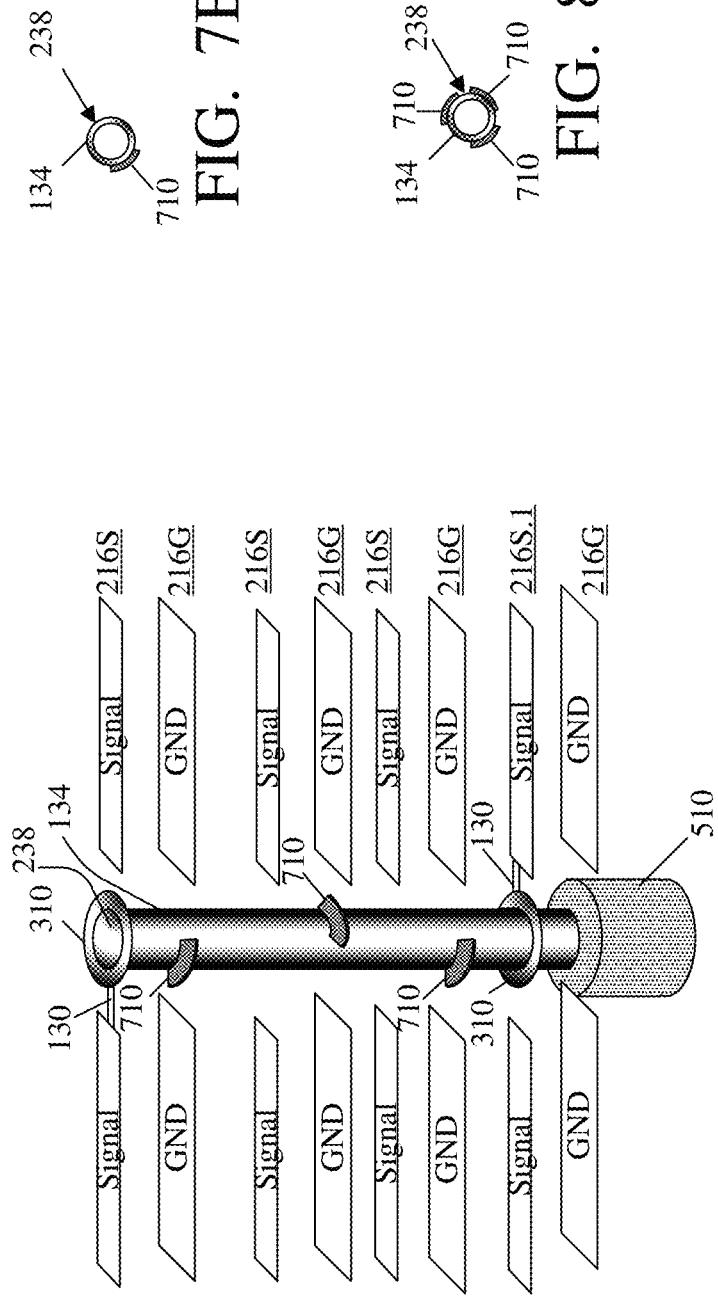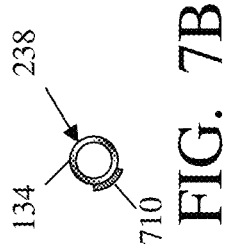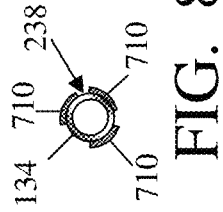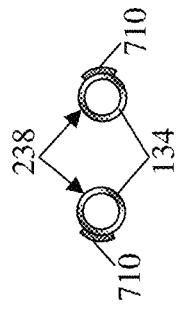

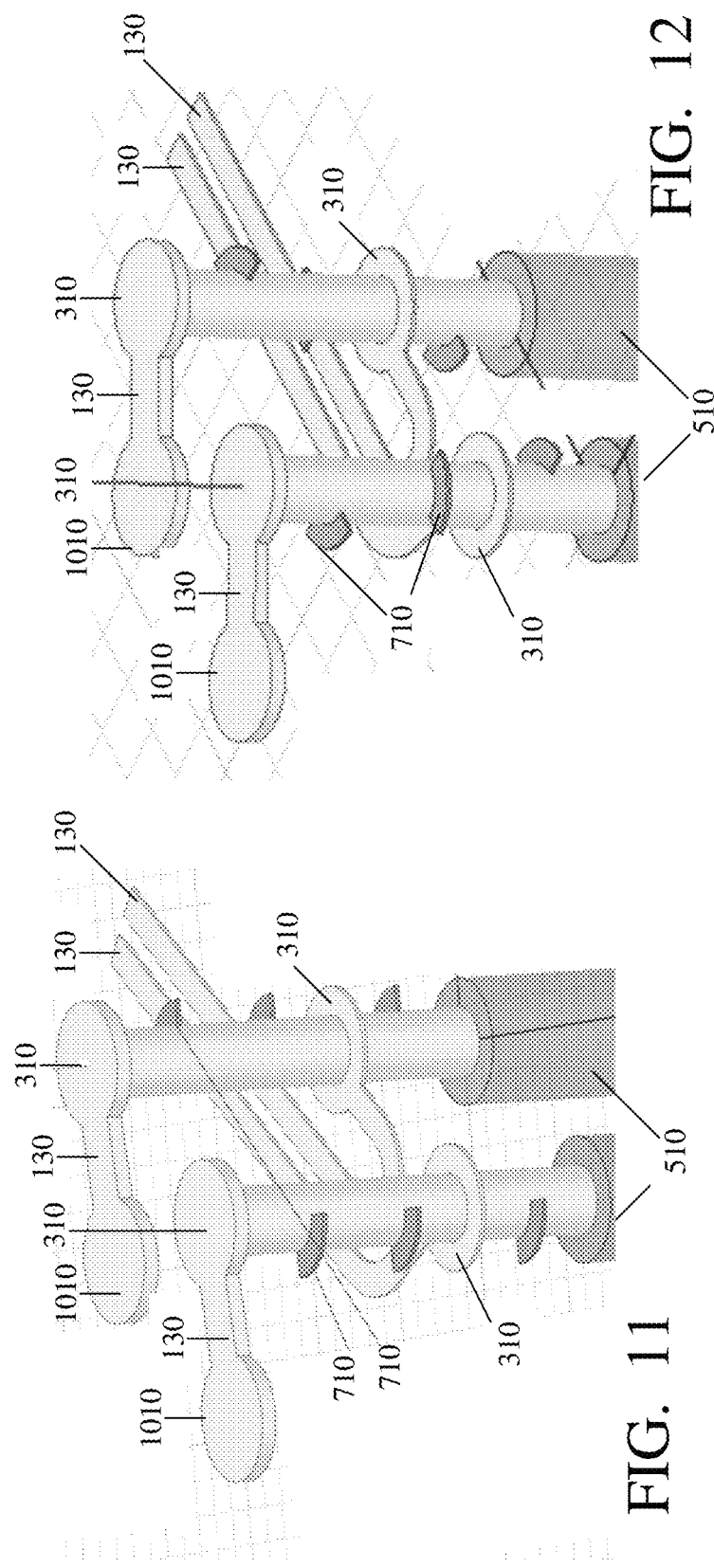
FIG. 11
FIG. 12
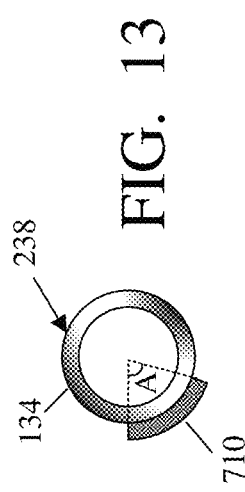
FIG. 13

PRINTED CIRCUIT BOARDS WITH NON-FUNCTIONAL FEATURES

BACKGROUND

The present disclosure relates to interconnection devices, and more particularly to printed circuit boards (PCB).

PCBs such as 110 (FIG. 1) are widely used for compact interconnection of electrical components 120 such as integrated circuits (ICs), IC packages, discrete components, cables, and connectors. Components 120 can be attached to the top and bottom of PCB 110 (only the top components are shown in FIG. 1), and can be interconnected by multiple layers of horizontal conductive traces 130 and vertical conductive vias 134. The PCB may be formed of multiple layers 210 (FIG. 2). Each layer 210 is fabricated separately, to include traces 130 on an electrically insulating surface of a corresponding substrate 220 (made of an electrically insulating material or non-insulating material covered by an insulator). The layers 210 are then attached to each other to form a stack, and the stack is pierced (possibly mechanically or by laser) to form holes 238 (FIG. 3). The holes are then plated with a conductive material (copper). The conductive material forms vias 134 interconnecting the traces 130 in different layers 210. Then components 120 are placed on the PCB and attached to traces 130, possibly by solder.

FIG. 4 shows schematically a high speed PCB, with signal planes 216S separated by ground planes 216G. Each plane 216S, 216G, is manufactured in a separate layer 210 (FIG. 2), and represents the circuitry formed in that layer. Each signal plane 216S includes the traces 130 of the corresponding layer 210. Each ground plane 216G includes a conductive layer extending laterally through the entire PCB and held at the ground potential during circuit operation. The ground planes reduce electromagnetic interference between the signal planes and between a signal plane and components 120. Some ground planes can be replaced by power voltage planes.

To achieve high signal speed, low power consumption, and high packing density, the traces 130 are made narrow, which complicates the alignment between holes 238 and traces 130. To facilitate the alignment, the traces are enlarged by circular pads 310 at the hole locations.

Each via 134 can be a blind via, extending down only as far as the bottommost plane 216S or 216G to which the via is connected (plane 216S.1 in FIG. 4). However, for manufacturing efficiency, the vias 134 can be through-vias, going all the way through the PCB. This is particularly efficient if the PCB would otherwise need blind vias of different depths. But a through via 134, passing through the PCB, undesirably has an unused portion ("stub") 134s below the plane 216S.1, and the stubs are bad for signal integrity as they create a resonance at higher frequencies. The stubs can be eliminated by a drilling process called backdrilling. Backdrilling is commonly used for high speed, differential vias, to reduce reflections and associated return loss problems. See U.S. Pre-Grant Patent Publication 2009/0045889 A1 (Feb. 19, 2009; inventors: Goergen et al.), incorporated herein by reference.

The backdrilling process creates a cylindrical hole 510 (FIG. 5) a few mils (milli-inches) below the lowest signal breakout point at a pad 310, i.e. pad 310 in plane 216S.1 in FIG. 5. If hole 510 is left unfilled, it exacerbates the thermal stress problems when surface mount components 120 are soldered onto the PCB. The thermal stress may cause the pads 310 to rotate (i.e. lift up). As a result, micro-cracks may develop at the interface 530 between the via 134 and the stripline traces 130. In fact, the stripline 130 may completely separate from via 134.

Therefore, the holes 510 are sometimes filled with epoxy. Alternatively or in addition, the PCB is provided with non-functional pads 310n (FIG. 6) to strengthen the structure and thus reduce the thermal stress at interfaces 530 of functional pads 310. The non-functional pads 310n are not required to aid assembly, alignment, or complete a signal path, and are not used to connect the via 134 to a trace 130 or a layer 216G. (Pads 310n can be used however to adjust the via impedance as described in the aforementioned patent publication 2009/0045889 A1.)

Both solutions epoxy filling and non-functional pads— have disadvantages. Epoxy filling adds to the assembly cost (about 10%), and the non-functional pads 310n can add parasitic capacitances detrimental to signal integrity. These capacitances are schematically shown at 540 in FIG. 6. These capacitances include the capacitances between a non-functional pad and other pads, and the capacitances between non-functional pads and planes 216G, 216S.

Accordingly, it would be desirable to provide an improved PCB robust in the presence of thermal stresses yet less expensive to manufacture.

SUMMARY

This section summarizes some features of some embodiments of the present disclosure. Other features are described below. The invention is defined by the appended claims, which are incorporated into this section by reference.

According to one embodiment, a non-functional pad is replaced by a sliver, possibly provided only on one side of a via 134. The parasitic capacitances 540 are reduced. Also, area is freed that can be used for other purposes, e.g. to increase a ground plane area.

Some embodiments include backdrilled holes, but the epoxy filling is omitted in some embodiments because the slivers improve the PCB robustness to make the filling unnecessary. For example, a backdrilled hole may be left filled with air.

Other features and advantages are described below. These features and advantages do not limit the invention. The invention is defined by the appended claims.

BRIEF DESCRIPTION OF THE DRAWINGS

FIG. 7A is an exploded view of a PCB according to some embodiments of the present invention.

FIG. 7B shows a horizontal cross section of a PCB according to some embodiments of the present invention.

FIGS. 8 and 9 are top views of PCBs according to some embodiments of the present invention.

FIGS. 11 and 12 are exploded views of PCBs according to some embodiments of the present invention.

FIG. 13 shows a horizontal cross section of a PCB according to some embodiments of the present invention.

DETAILED DESCRIPTION

This section describes some embodiments of the present disclosure. The invention is not limited to such embodiments except as defined by the appended claims.

This disclosure uses the following terminology. The terms "insulator", "insulating", etc. refer to electrical insulation unless stated otherwise. Likewise, the terms "conductor", "conductive", etc. refer to electrical conductivity unless stated otherwise. The terms "capacitor", "capacitance", etc. refer to electrical capacitance unless stated otherwise.

Figure 6:
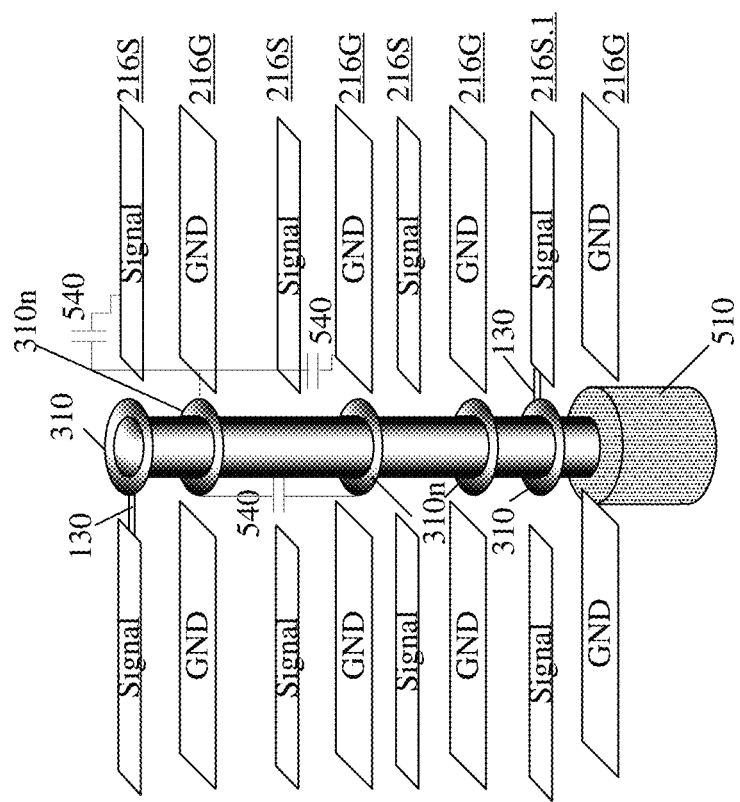

FIG. 7A illustrates an embodiment of the present disclosure, similar to FIG. 6, but with slivers 710 instead of non-functional pads 310n. FIG. 7B shows a horizontal cross-sectional across a sliver 710. Each sliver 710 can be shaped as a sector of a non-functional pad 310n of FIG. 6, but other shapes can be also used. In the example of FIGS. 7A, 7B, each hole 238 is round in top view. Via 134 is a circular (cylindrical) liner on the hole's sidewalls. Sliver 710 is a sector of a ring surrounding the hole 238. The sliver thickness can be, for example, as large as the thickness of non-functional via 310n of FIG. 6. In some embodiments, the diameter of hole 238 is 12 mil; the outer diameter of sliver 710 is 14 mil; and the angle spanned by sliver 710 is 20° to 150°, e.g. 70°. The backdrilled hole 510 is unfilled, and has a diameter of 50 mil. In other embodiments, the backdrilled hole 510 is partially or completely filled with epoxy, or is absent. Other shapes and dimensions are possible. Further, different slivers 710 may have different shapes or dimensions at the same via 134 and/or at different vias in the same PCB.

Due to its smaller area, sliver 710 adds less parasitic capacitance than a non-functional pad of the same diameter.

In FIGS. 7A and 7B, every two consecutive slivers 710 down the via 134 are positioned on opposite sides of the via, and they have identical shapes and dimensions, in order to provide greater rotational uniformity of thermal stresses. The slivers are rotationally symmetric in top view relative to each other; the rotation axis is the center axis of hole 238, and the rotation angle is 180° between the slivers. In some embodiments, other rotation angles are used, e.g. 60° in FIG. 8, which shows the top view of three slivers at three respective different planes 216.

The invention is not limited to rotation angles or symmetry. The slivers can be provided at different vias as needed to achieve desired capacitances or other electrical characteristics and improve mechanical integrity of the structure. Some vias may have no slivers. Non-functional pads 310n may or may not be used in the same PCB in addition to slivers 710.

Each sliver 710 is positioned in a respective layer 210 corresponding to a ground plane, or a power voltage plane, or some other reference voltage plane. Slivers 710 can also be part of a signal plane. In some embodiments, a sliver is provided as an isolated feature of a signal plane, at a via not physically contacting any part of the signal plane other than the sliver.

FIG. 9 is a top view of a differential via pair, carrying a differential signal. The sliver 710 at each via faces away from the other via to minimize the capacitive coupling between the slivers and prevent a dip in the differential impedance and hence to increase the differential signal speed and integrity. The slivers 710 may or may not be part of the same plane 216.

Figure 4:
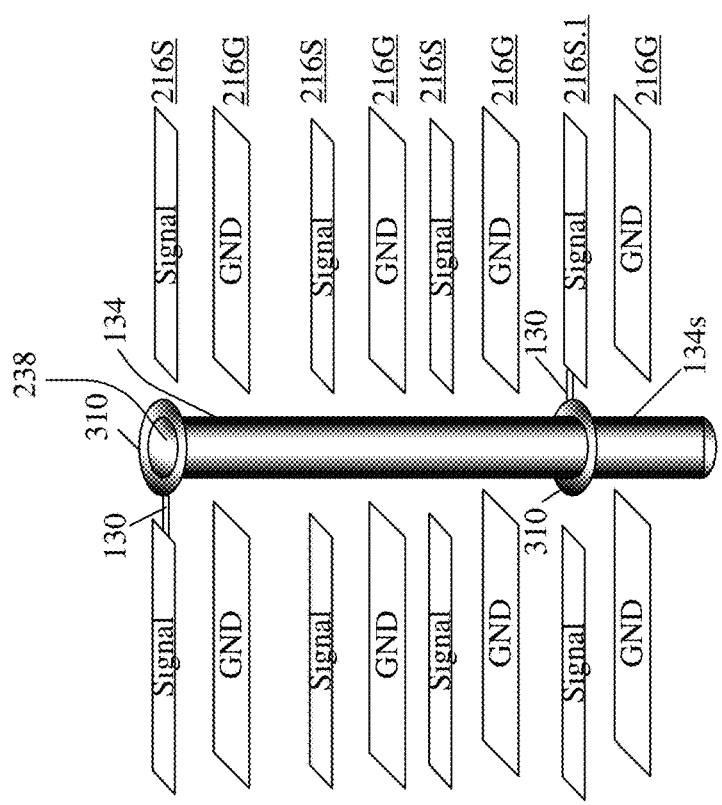
Figure 10:
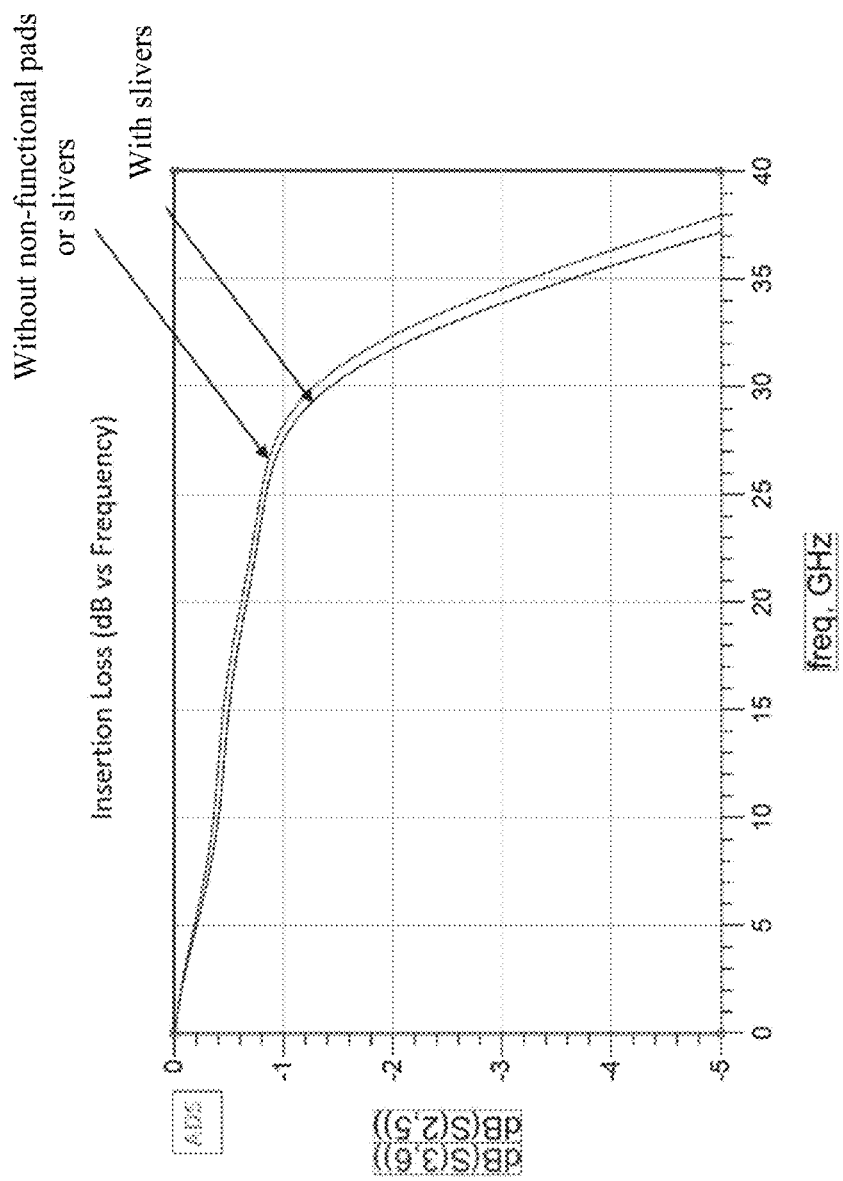
FIG. 10 shows loss versus frequency plots for simulated PCB embodiments of the present invention and prior art.

FIG. 10 shows two graphs of simulated insertion loss versus frequency for respective two differential via structures. The top curve is obtained for the structure as in FIG. 4, without either non-functional pads or slivers. The bottom curve is obtained for a structure as in FIGS. 7A, 7B. In both cases, the distance between the via centers was 1 mm; each via's hole 238 diameter was 12 mils; the outer diameter of each pad 310, and of each sliver 710, was 14 mils; and the stub 510 diameter was 50 mils. Each sliver 710 spanned the angle of 70°. Clearly, the insertion loss is almost the same in the two structures.

FIGS. 11 and 12 illustrate two differential via structures with slivers 710. Contact pads 1010 are to be soldered to respective contact pads of surface mount components 120 (not shown in FIGS. 11 and 12). In other embodiments, at least some contact pads of components 120 are soldered directly to top pads 310, e.g. as in Via in Pad Plated Over (VIPPO) structures.

In FIGS. 11 and 12, each of a number of planes 216 is provided with two slivers 710 at the respective two vias. The planes are ground or power voltage planes in some embodiments, though other types of planes can be used. In FIG. 11, in each plane having slivers, the slivers are on the opposite sides of each other, and the sliver at each via is on the opposite side of the other via, to minimize the capacitive coupling between the slivers and reduce differential impedance dip. In FIG. 12, the sliver positions change from plane to plane down the via: in one plane the slivers are as in FIG. 11; and in every subsequent plane having slivers, the slivers are rotated around their respective vias by some angle (the same angle for both slivers). The thermal stress reduction can be more uniform than in FIG. 11. Other sliver positions are also possible.

The slivers can be provided at buried vias and at blind vias.

Figure 2:
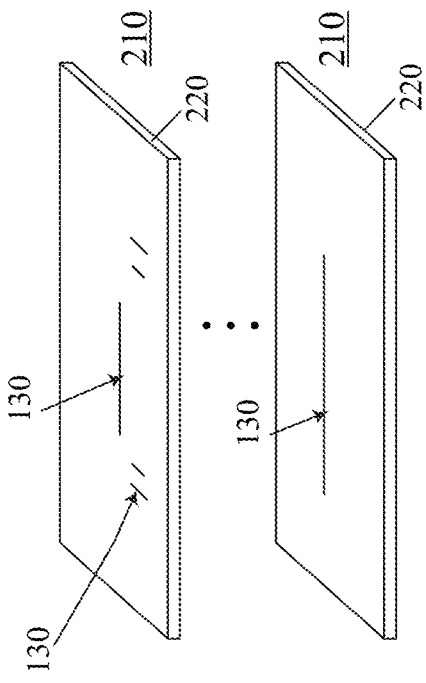
FIG. 2 is a perspective view of a prior art PCB in the process of manufacture.
Figure 1:
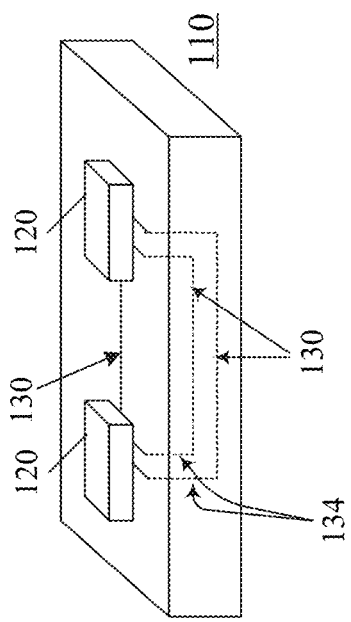
FIG. 1 is a perspective view of components interconnected by a PCB according to prior art.
Figure 3:
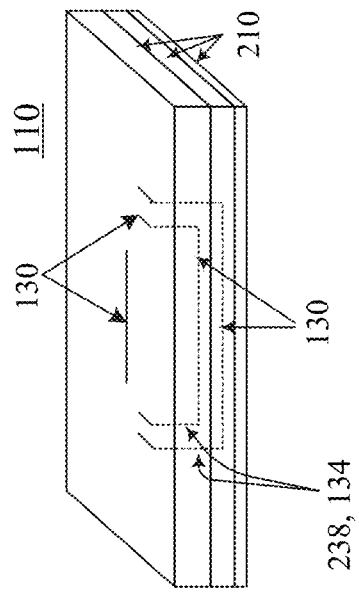
FIG. 3 is a perspective view of a prior art PCB.
Figure 5:
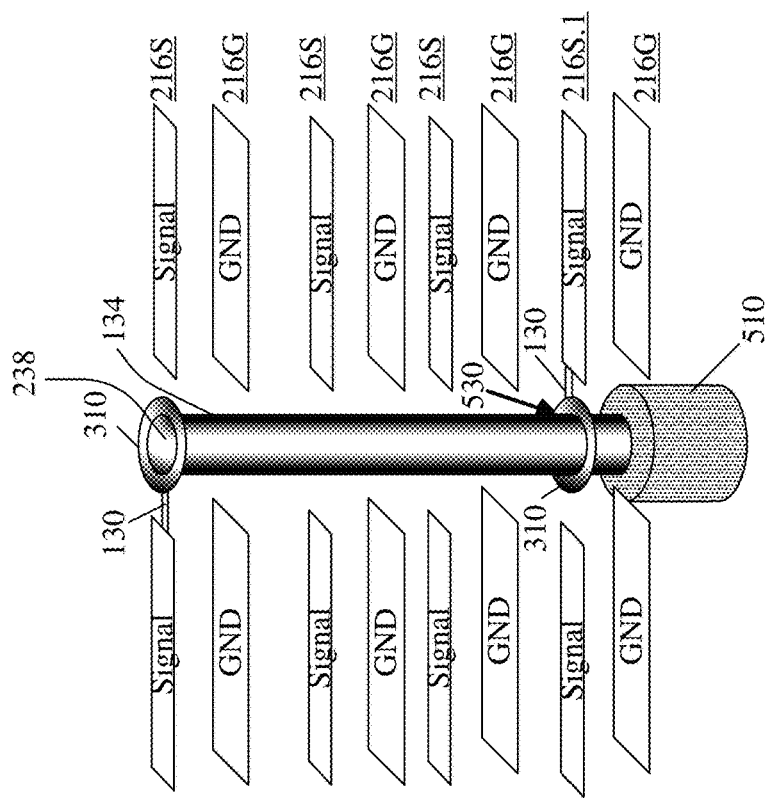
FIGS. 4, 5, 6 are exploded views of prior art PCBs.

The slivers can be manufactured by conventional methods. For example, each substrate 220 can be provided with a conductive layer (copper or another material) patterned to provide traces 130 or a ground or power voltage plane, and also to provide slivers 710 in some or all of the planes. The patterning can be additive or subtractive as known in the art. Then the substrates can be attached to each other to form a stack as described above in connection with FIG. 3, and the stack can be pierced with holes 238. The holes can be lined or filled with conductor 134.

Some embodiments of the present disclosure are defined by the following clauses.

Clause 1 defines a printed circuit board (PCB) comprising:

a stack of layers (e.g. 210) each of which comprises an insulator and comprises a portion of a circuitry of the printed circuit board (the circuitry may include a signal plane 216S, a ground plane, a power voltage plane, a reference voltage plane);

one or more holes (e.g. 238) each of which passes through one or more of the layers; and one or more conductive vias (e.g. 134) each of which is formed in a corresponding one of the one or more holes, each via comprising a portion of the circuitry and passing through one or more of the layers;

wherein each of one or more of the layers comprises one or more conductive non-functional features (NFFs, e.g. 710), each NFF physically contacting a corresponding via that is one of the one or more vias, wherein an interface between each NFF and the corresponding via does not completely laterally surround the corresponding via.

2. The PCB of clause 1, wherein each NFF is integral with its corresponding via. (For example, a sliver 710 can be continuous with the via 134, e.g. a continuous monocrystalline copper structure.)

3. The PCB of clause 1 or 2, wherein each NFF comprises over 50 mass % of metal (e.g. copper), and the corresponding via comprises over 50 mass % of the same metal.

4. The PCB of any preceding clause, wherein for each NFF, the corresponding via physically contacts, in the corresponding layer, only the NFF and the insulator.

5. The PCB of any preceding clause, wherein in top view, at least one NFF forms a ring sector, and the interface between the NFF and the corresponding via is an arc of an inner circle of the ring sector. (See FIG. 7B for example. If the via is circular, the sliver 710 may or may not be concentric with the via.)

6. The PCB of clause 5, wherein the ring sector spans an angle of at most 150°. (The ring sector angle is shown as "A" in FIG. 13, which is otherwise an enlarged copy of FIG. 7B.)

7. The PCB of any preceding clause, wherein in top view, for at least one NFF, the corresponding interface has a length of at most 150/360 of a length of the corresponding via's circumference at the corresponding layer. (For example, if the angle A in FIG. 13 is 150°, then the via-sliver interface is 150/360 of the via's circumference.)

8. The PCB of clause 7, wherein the corresponding via physically contacts, in addition to the NFF, only the insulator in the corresponding layer. (For example, if the corresponding layer is a ground plane, and the via does not physically contact the ground plane, the via may contact only the sliver and the insulator of the corresponding layer.)

9. The PCB of any preceding clause, wherein for at least one said NFF, the hole containing the corresponding via passes through the PCB, and the corresponding via passes through a length of the hole but not the entire hole, the hole's diameter being enlarged in the hole's portion beyond the via. (For example, the backdrilled hole 510 may have a larger diameter than the rest of the hole.)

10. The PCB of any preceding clause, wherein for at least one said NFF, the corresponding via is one of a pair of differential vias.

11. The PCB of clause 10, wherein each via in the pair physically contacts at least one NFF.

12. The PCB of clause 10 or 11, wherein at least one NFF physically contacting one of the vias of the pair faces away from the other via of the pair.

13. The PCB of clause 10, 11, or 12, wherein each via of the pair physically contacts one or more NFFs facing away from the other via of the pair.

14. The PCB of clause 10, 11, 12, or 13, wherein at least one of the vias of the pair physically contacts a plurality of corresponding NFFs that are located in different layers at different angular positions relative to the corresponding via.

15. The PCB of clause 14, wherein the other one of the vias of the pair physically contacts a plurality of corresponding NFFs that are located in different layers at different angular positions relative to the corresponding via.

16. A printed circuit board (PCB) comprising:
a stack of layers each of which comprises an insulator and comprises a portion of a circuitry of the printed circuit board;
one or more holes each of which passes through one or more of the layers; and
one or more conductive vias each of which is formed in a corresponding one of the one or more holes, each via comprising a portion of the circuitry and passing through one or more of the layers;
wherein each of one or more of the layers comprises one or more conductive non-functional features (NFFs), each NFF physically contacting a corresponding via that is one of the one or more vias, but not completely laterally surrounding the corresponding via.

17. The PCB of any preceding clause, wherein in top view, at least one NFF protrudes from the corresponding via as a strip running along the corresponding via's circumference and having a uniform width. (For example, in FIG. 7B, the sliver is a ring sector whose width is the difference between the outer and inner ring diameters.)

18. The PCB of any preceding clause, wherein in top view, at least one NFF is a strip running along the corresponding hole's boundary and having a uniform width. (For example, in FIG. 7B, the sliver runs along the via's circumference, which in turn abuts the hole's boundary.)

19. The PCB of any preceding clause, wherein for at least one NFF, the corresponding via is one of a pair of differential vias.

20. A method for manufacturing a printed circuit board (PCB), the method comprising:
forming a plurality of layers each of which comprises an insulator and comprises a portion of a circuitry of the printed circuit board, wherein each of one or more of the layers comprises one or more conductive features each of which comprises one or more non-functional features (NFFs); then
attaching the layers to each other to form a stack of the layers; then
forming one or more holes through one or more of the layers, wherein each of one or more of the holes has a boundary shared with at least one NFF that does not completely laterally surround the hole; then
forming one or more conductive vias comprising a portion of the circuitry and passing through one or more of the layers, each via being formed in a corresponding one of the one or more holes, wherein the boundary of each NFF physically contacts a via formed in the hole sharing the boundary with the NFF.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:
1. A printed circuit board (PCB) comprising:
a stack of layers each of which comprises an insulator and comprises a portion of a circuitry of the printed circuit board;
two or more holes each of which passes through one or more of the layers; and
two or more conductive vias each of which is formed in a corresponding one of the two or more holes, each via comprising a portion of the circuitry and passing through one or more of the layers;
wherein each of one or more of the layers comprises one or more conductive non-functional features (NFFs), each NFF physically contacting a corresponding via that is one of the two or more vias, wherein an interface between each NFF and the corresponding via does not completely laterally surround the corresponding via;
wherein for at least one said NFF, the corresponding via is one of a pair of differential vias and the corresponding via physically contacts, in the corresponding layer, only the NFF and the insulator, the corresponding layer having only one NFF physically contacting the corresponding via, and the NFF faces away from the other via of the pair.

2. The PCB of claim 1, wherein each NFF is integral with its corresponding via.

3. The PCB of claim 2, wherein each NFF comprises over 50 mass % of metal, and the corresponding via comprises over 50 mass % of the same metal.

4. The PCB of claim 1, wherein for each NFF physically contacting any differential via of the pair, the corresponding via physically contacts, in the corresponding layer, only the NFF and the insulator, and the NFF faces away from the other via of the pair.

5. The PCB of claim 4, wherein each via in the pair physically contacts at least one NFF.

6. The PCB of claim 4, wherein each via of the pair physically contacts one or more NFFs facing away from the other via of the pair.

7. The PCB of claim 4, wherein for at least one NFF physically contacting any differential via of the pair, the corresponding layer includes an NFF physically contacting the other via of the pair.

8. The PCB of claim 4, wherein for each NFF physically contacting any differential via of the pair, the corresponding layer includes an NFF physically contacting the other via of the pair.

9. The PCB of claim 1, wherein in top view, at least one NFF forms a ring sector, and the interface between the NFF and the corresponding via is an arc of an inner circle of the ring sector.

10. The PCB of claim 9, wherein the ring sector spans an angle of at most 150°.

11. The PCB of claim 1, wherein in top view, for at least one NFF, the corresponding interface has a length of at most 150/360 (150 divided by 360) of a length of the corresponding via's circumference at the corresponding layer.

12. The PCB of claim 11, wherein the corresponding via physically contacts, in addition to the NFF, only the insulator in the corresponding layer.

13. The PCB of claim 1, wherein for at least one said NFF, the hole containing the corresponding via passes through the PCB, and the corresponding via passes through a length of the hole but not the entire hole, the hole's diameter being enlarged in the hole's portion beyond the via.

14. The PCB of claim 1, wherein for said at least one NFF physically contacting one of the vias of the pair, said facing away from the other via of the pair reduces a differential impedance dip caused by the NFF when the pair carries a differential signal.

15. The PCB of claim 14, wherein the differential signal has a frequency of at least 1 GHz.

16. A printed circuit board (PCB) comprising:
a stack of layers each of which comprises an insulator and comprises a portion of a circuitry of the printed circuit board;
two or more holes each of which passes through one or more of the layers; and
two or more conductive vias each of which is formed in a corresponding one of the two or more holes, each via comprising a portion of the circuitry and passing through one or more of the layers;
wherein each of one or more of the layers comprises one or more conductive non-functional features (NFFs), each NFF physically contacting a corresponding via that is one of the two or more vias, but not completely laterally surrounding the corresponding via;
wherein the conductive vias include a first via and a second via which are operable as differential vias when a differential signal is carried by the first and second vias; and
at least one NFF physically contacts the first via and faces away from the second via to reduce a differential impedance dip caused by the NFF when the differential signal is carried by the first and second vias, the NFF being part of a layer that has only one NFF physically contacting the first via.

17. The PCB of claim 16, wherein in top view, said at least one NFF protrudes from the first via as a strip running along the first via's circumference and having a uniform width.

18. The PCB of claim 16, wherein in top view, said at least one NFF is a strip running along the corresponding hole's boundary and having a uniform width.

19. The PCB of claim 16, wherein each of the first and second vias physically contacts one or more NFFs facing away from the other one of the first and second vias.

20. The PCB of claim 16, wherein the differential signal has a frequency of at least 1 GHz.

\* \* \* \* \*